United States Patent [19]

Thai et al.

[11] Patent Number: 4,722,822

[45] Date of Patent: Feb. 2, 1988

[54] COLUMN-CURRENT MULTIPLEXING DRIVER CIRCUIT FOR HIGH DENSITY PROMS

[75] Inventors: Phi Thai, San Jose; Barry S. Cornell, Santa Clara, both of Calif.

[73] Assignee: Advanced Micro Devices, Inc., Sunnyvale, Calif.

[21] Appl. No.: 802,568

[22] Filed: Nov. 27, 1985

[51] Int. Cl.[4] .................... G11C 7/00; G11C 17/06
[52] U.S. Cl. ................................ 365/96; 365/226; 365/203; 365/105
[58] Field of Search .............. 365/94, 96, 226, 203, 365/105

[56] References Cited

U.S. PATENT DOCUMENTS

| | | | |
|---|---|---|---|
| 3,582,908 | 6/1971 | Koo | 365/96 |
| 3,611,319 | 10/1971 | Hyatt | 365/96 X |
| 4,130,889 | 12/1978 | Chua | 365/189 X |
| 4,319,341 | 3/1982 | Fukushima et al. | 365/96 X |
| 4,441,167 | 4/1984 | Principi | 365/94 |

Primary Examiner—Stuart N. Hecker
Assistant Examiner—Alyssa H. Bowler
Attorney, Agent, or Firm—Patrick T. King; Stephen C. Durant

[57] ABSTRACT

Current switches are used to control current into the columns during READ operations of a PROM. The circuit provides one such switch for each of the columns of the PROM and makes possible the use of a single current source which is connected to each of the switches but supplies current only to the column of the PROM that is currently selected for reading. A high voltage pre-bias is applied to the collectors of the NPN transistors used as current switches such that turn-on speed is improved because the collector parasitic capacitances are pre-charged to near the supply potential.

13 Claims, 3 Drawing Figures

COLUMN-CURRENT MULTIPLEXING DRIVER CIRCUIT FOR HIGH DENSITY PROMS

BACKGROUND OF THE INVENTION

This invention relates generally to the field of matrix-array binary-logic read-only memory devices, more particularly to high-density programmable read-only memory (PROM) devices, and especially, to the portions of these devices used for reading the contents of the memory and presenting an output signal indicative of the information stored in memory.

PROMs have come into widespread use in a variety of computer and other logic-circuit applications since they offer the ability to retain data in a permanent, non-volatile form, such that no precautions need be taken to ensure the retention of data during power failures. They are thus used very successfully to retain the most basic and often-used programs and routines in a computer, for example.

The data stored in a PROM is retained by a large number of memory cells (4,000 to 64,000 and more in high-density types), each one of which holds a binary-logic 0 or 1 after data has been written into the PROM. Each memory cell is located at a discrete bit location within the matrix array of conductive rows and conductive columns, corresponding to the point of crossing of one row and one column. Accordingly, each cell has a unique address within the array corresponding to the identity of the row and column at whose juncture the cell is located.

Within each memory cell a binary 0 or 1 is represented simply by whether the cell does or does not provide a conductive path between the associated row and column. For this purpose, each cell may be series combination of a Schottky diode and a fusible link, connected to permit the flow of current from the column to the row across the bit location only if the fusible link is intact.

Throughout the remainder of this patent application, the presence of such a conductive path through an intact fusible link will be taken to represent a binary value of 0 stored in the associated cell. Conversely, if the link was blown during the process of writing data into the PROM, this will be taken to represent a binary 1 stored in the cell. Of course, the opposite logic convention could equally well be adopted in appropriate circumstances.

One method of reading the contents of a memory cell involves circuitry located on the PROM chip which applies a logic HIGH signal to one member of the associated row-column pair and a LOW to the other member of the pair. The presence of the fusible link can then be inferred from the voltage level at the addressed memory cell, which will be HIGH or LOW depending on whether the cell is conductive or not.

In PROMs of the sort with which this invention is concerned, the memory cells are individually read at very high speed by a technique which involves the selecting of the column and row of the cell and the application of a current source to the column while the associated row is held low, near ground. This scheme results in the voltage level of the column rising abruptly if the fuse is blown, representing a logic 1. The absence of this rise in voltage to a logic HIGH, indicating that the fuse is intact, represents a logic 0.

While this scheme works well, it has been carried out by circuit means which involve the provision of a separate current source for each of the columns. This has the disadvantage of producing unnecessary current consumption in the current sources associated with columns which are not selected for reading.

Such unnecessary current consumption has sometimes been tolerable in low-density PROMs, but as density has risen it has become an increasing problem. Moreover, the necessity to provide a separate current source for each column has resulted in limiting the current provided from each source in the interests of keeping power consumption and dissipation within acceptable limits.

DESCRIPTION OF THE RELATED ART

U.S. Pat. No. 4,215,282 issued July 29, 1980 to Brown et al. and is commonly assigned with the present application. This patent details a column-drive circuit (which is shown as part of the sense amplifier of FIG. 1 in the patent) in which separate current sources S1K . . . SNK are provided, one for each of the N columns in one of K outputs.

The path of current flow from current source S1K in FIG. 1 of the patent is controlled by the inputs to the AND circuit consisting of diodes D11K, D12K, and D13K, such that when the associated column has been selected diodes D11K and D12K have HIGH inputs. Under this circumstance current from source S1K can flow into the associated column through D13K.

If the fuse between the selected row and column is intact, this current can flow to the LOW created by the word-line driver. Column voltage then will not rise, representing a logic 0. If the fuse is blown, current will flow into the column to charge the capacitance associated with the column, causing voltage on the column to rise rapidly to represent a logic 1.

However, current from each one of current sources S1K . . . SNK continues to flow whether or not the associated column has been selected. In the scheme of this prior art patent, a column is deselected when its column decoder input goes LOW, such that the associated current source sends its current to the column decoder through diode D11K . . . DN1K for any such column which has been deselected. As a result, current is supplied constantly by current sources S1K . . . SNK and consequently power consumption and dissipation are needlessly high.

SUMMARY OF THE INVENTION

An object of the present invention is to provide a column-driver circuit for use in reading read-only memories in which circuit power consumption in the deselected columns of the read-only memory is reduced or substantially eliminated.

A second object of the present invention is to provide a column-driver circuit for a read-only memory which circuit is capable of increased speed when compared to the known column-driver circuits.

A third object of the present invention is to provide a column-driver circuit for a read-only memory in which selected-column driving current is supplied to any selected one of a plurality of columns from a single current source.

A fourth object of the present invention is to provide a column-driver circuit having current-source multiplexing means to direct the current from a single current source to any selected one of a plurality of columns.

A fifth object of the present invention is to provide a column-driver circuit in which column-driving speed is enhanced by a driver output pre-bias means whereby switching speed of the driver is enhanced.

To the above ends, the column-driver circuit according to the present invention employs a switch means having an input and an output, and having an input-output transfer function which can be defined as follows: the switch means responds to logic HIGH and LOW signals at its input by producing a high or low impedance at its output.

The output terminals are connected in series circuit relation between a column-driver current source and the column so as to control current into the column from the current source in accordance with the magnitude of the impedance at the output.

The switch means produces a low impedance at its output when its column address decoder input presents a logic HIGH (select) signal. The inrush of current into the column from the current source quickly raises the column voltage to a logic HIGH if the column impedance is high (corresponding to a blown fuse at the bit location between the selected column and the selected row).

The column voltage remains LOW if the column impedance is low (indicating an intact fuse at the bit location between the selected column and the selected row). In this sense then, the resulting column voltage on the selected column represents an ANDed function of the column address decoder input and the impedance of the column.

Since current flows from the column-driver current source only into a selected column, a single source of current can be used to drive any one of a number N of columns by being commonly connected to the N switch means associated with the columns. Since all columns except the selected column are deselected and will thus draw no current from the source, power consumption and dissipation are very significantly reduced compared to column drivers in which each column is provided with a continuously operating current source.

The speed with which each column can be selected and read is limited by the time needed for the current from the column-driver current source to charge the parasitic capacitances associated with the column to a logic HIGH signal level. Since only a single current source need be provided to supply all of the columns to be read, that current source can be provided with a higher current capacity without exceeding consumption or dissipation limitations than is possible when each column must be provided with its own current source.

Speed is further enhanced by an output pre-bias circuit associated with the output of each switch means fo the present invention. The output pre-bias circuit maintains the parasitic capacitances associated with the output of the switch means in a pre-charged condition.

The above and other features, objects and advantages of the present invention together with the best mode contemplated by the inventors thereof for carrying out their invention will become more apparent from reading the following description of a preferred embodiment of the invention and from studying the associated drawing, in which:

DETAILED DESCRIPTION OF THE PRESENT INVENTION

Figure 1:
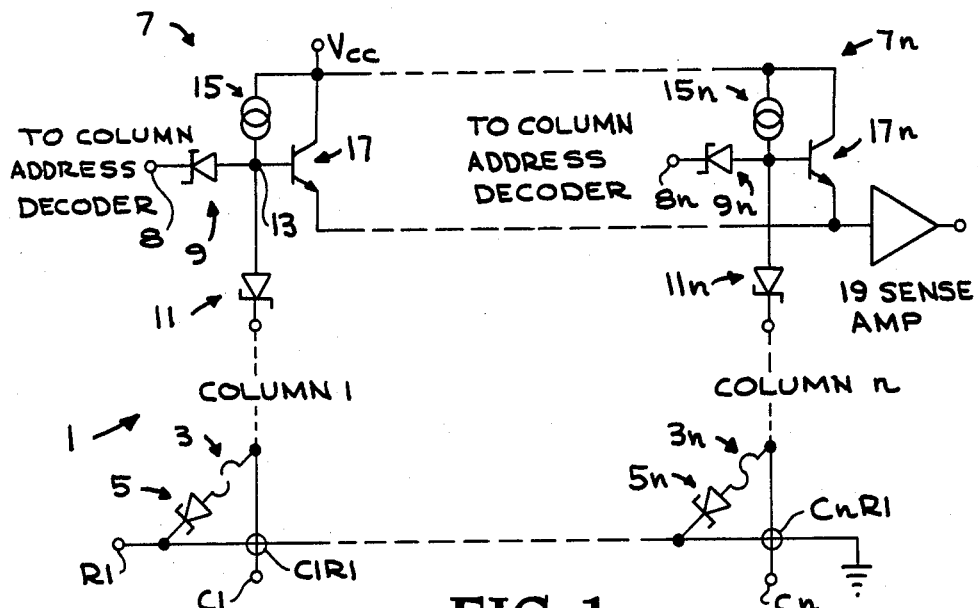
FIG. 1 is a schematic circuit diagram of a prior art column-driver circuit for use in reading PROM circuits.

FIG. 1, labeled "Prior Art" is a simplified showing of the column-drive scheme utilized in prior art PROMs of the sort exemplified by the aforecited U.S. Pat. No. 4,215,282. The novel circuit features involved in the temperature-compensation scheme of that patent have been left out of FIG. 1 in the interest of clarity.

In FIG. 1, a prior art column-driver circuit 1 is shown connected to the N columns of an N-column by M-row matrix-array. Although the simplified showing of FIG. 1 includes only one row R1 and the first and last of the N columns C1 and Cn, it will be understood that this array has $N \times M$ bit locations, one at each of the $N \times M$ crossings of its N columns and M rows. The memory array illustrated in FIG. 1 represents only one of K outputs of the PROM, such that the full PROM array would have $K \times N$ columns and M rows, defining a total of $K \times N \times M$ matrix bit locations.

Two of such bit locations are shown in FIG. 1 to illustrate the means whereby binary data is stored in the matrix-array PROM. The bit location C1R1 between R1 and C1 is shown with a blown fuse 3 and a Schottky diode 5 extending in series from C1 to R1. The blown fuse of course breaks the conductive path which existed between C1 and R1 prior to writing data into the memory array, and will be taken within the context of the present patent application to represent a logic 1 stored at the bit location C1R1.

The bit location CnR1 is shown with an intact fuse $3n$ and a Schottky diode $5n$ forming a conductive path for current in a direction from Cn to R1. By the convention of the preceding paragraph, this fuse condition will be taken to represent a logic 0 stored at the bit location CnR1.

In order to read the data bit stored at bit location C1R1, a column-driver 7 is shown, including a column address decoder input 8 labeled "To Column Address Decoder". This input is provided with a Schottky diode 9, and a similar column 1 input is also provided with a Schottky diode 11. At the node 13 between diodes 9 and 11 a current source 15 and the base terminal of an NPN transistor 17 are connected. Current source 15 and the collector of transistor 17 connect to a source of dc voltage Vcc.

The operation of the column-driver scheme of this prior-art PROM will be illustrated by the reading of the binary 1 stored at bit location C1R1. The reading of this bit occurs when the column address decoder (not shown) selects C1 and a word driver or row decoder (not shown) selects R1.

Within the context of the present application, the column decoder select signal will be taken to be a logic HIGH signal applied to node 8 (for example, 5 volts dc), while the row select signal will be taken to be a logic LOW signal applied to node R1 (for example, 0 volts or ground potential). Further, it will be assumed that all columns except the selected one are deselected by a column address decoder LOW input, and all rows except the selected row are deselected by a word driver HIGH input.

Accordingly, FIG. 1 illustrates R1 in a selected state symbolized by the ground symbol at the right end of R1. Current from source 15 cannot flow from C1 to R1 to reach this ground because of the blown fuse 3 at C1R1. But, so long as the column address decoder input at input terminal 8 is LOW (deselect), current from source 15 is shunted away from column 1 through diode 9, preventing the voltage on C1 from rising.

However, when the column address decoder input 8 is driven HIGH (select), current from source 15 no longer "sees" a low potential sink, and rapidly charges column C1 through diode 11 to a logic HIGH. Transistor 17, connected as a low-output-impedance emitter follower, provides a HIGH on its emitter output, thus completing the operation of reading the data bit stored at C1R1.

Each of the other N columns (not shown) is provided with a column-driver (not shown) identical to column-driver 7. As shown, the column-driver 7n for the Nth column comprises input node 8n, diodes 9n and 11n, current source 15n andn NPN transistor 17n arranged identically to driver 7 for C1.

When column N is selected for reading, its column address decoder input goes HIGH as in the case of C1. However, since fuse 3n at bit location CnR1 is intact, the voltage on Cn will not rise but will remain LOW, representing a logic 0 at bit location CnR1.

The emitter outputs of each of the N column-drivers are joined together and connected to the input of a sense amplifier 19 which may invert or adjust logic levels as desired.

While this prior-art column-driver scheme works acceptably, especially in low density PROMs, its performance is not optimum for use in high density PROMs. In particular, it requires N separate current sources each having adequate current capacity to drive a column. These current sources are active continuously since their current will flow into the column address decoder line even when their respective columns are not selected.

Figure 2:
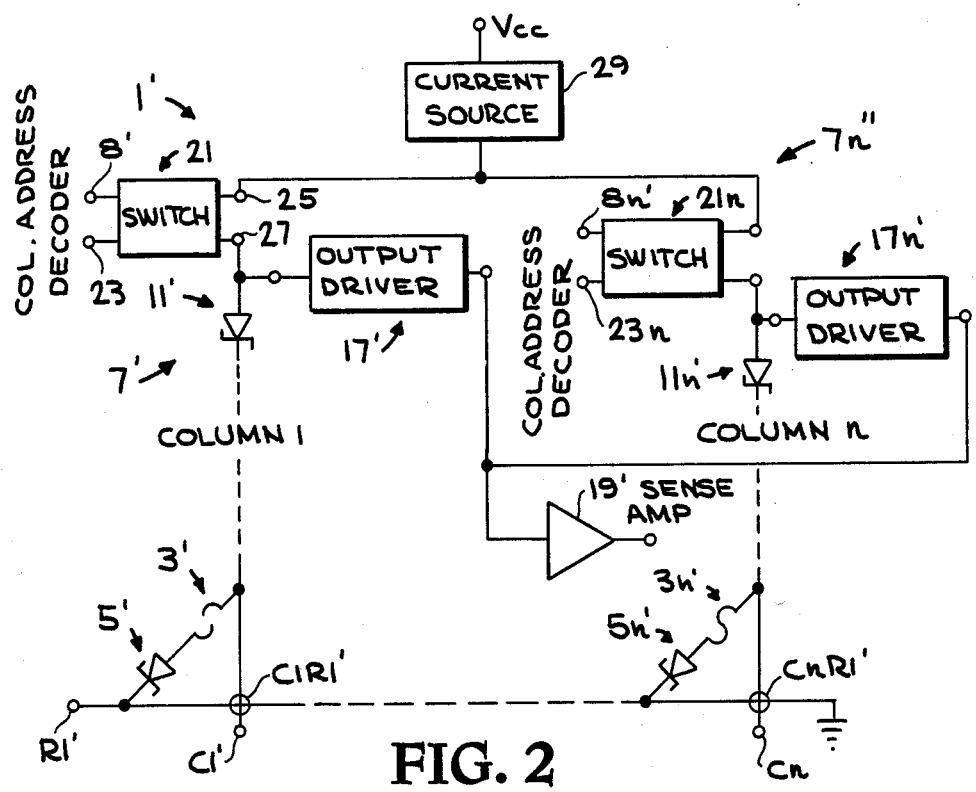
FIG. 2 is a simplified schematic block diagram of a column-driver circuit according to the present invention.

Turning now to FIG. 2, a block diagram of a column-driver circuit 1' according to the present invention is shown in include a column-driver 7' for driving column C1', having a switch 21. Switch 21 has a pair of input terminals 8' and 23 together defining an input port of switch 21, and a pair of output terminals 25 and 27, together defining an output port of switch 21.

The input-to-output transfer function of switch 21 may be defined as follows: Whenever a logic HIGH is present at the input port, as for example when terminal 8' is HIGH with respect to terminal 23, the output impedance presented at the switch 21 output port between terminals 25 and 27 will be low. Conversely, when the signal at the input port is LOW, i.e. when the differential voltage between terminals 8' and 23 is LOW, the output impedance between terminals 25 and 27 will be HIGH.

As shown in FIG. 2, terminal 27 connects to column 1 (C1) as does a low impedance output driver 17'. A current source 29 is connected between output terminal 25 and a source of dc potential Vcc.

As in FIG. 1, each of the other of the N columns is provided with a similar circuit, although only the last (Nth) such circuit has been shown. Unlike FIG. 1, however, all of the individual column-drivers in column-driver circuit 1' share current source 29, which is thus commonly connected to supply current to any column-driver which is selected.

In operation, the circuit of FIG. 2 would read the logic 1 stored at bit location C1R1' as follows: The select HIGH signal sent by the column address decoder to terminal 8' causes a logic HIGH signal to be present at the input of switch 21. This assumes, of course, that terminal 23 is held low either by external connection (not shown) to a circuit ground or other low-voltage point, or by internal connection within switch 21 to such a point as will become clearer in the discussion of FIG. 3 that follows. In either case, the voltage of terminal 23 only needs to be low enough that the differential voltage of terminal 8' above terminal 23 is interpreted by switch 21 as a input HIGH signal.

Switch 21 responds to this condition by producing a low impedance between its output terminals 25 and 27, permitting an inrush of current from source 29 into C1', which rapidly charges the substantial parasitic column capacitances up to a logic HIGH because of the blown fuse at C1R1'. The HIGH signal is transfered to sense amplifier 19' by output driver 17'.

The operation of the Nth column-driver in reading Cn is similar except as in the case of FIG. 1, the intact fuse at CnR1' prevents the output from rising, producing a logic 0.

However, what is very different in FIG. 2 from the operation of FIG. 1 is the absence of wasted current in column-drivers which are deselected by the column address decoder. In FIG. 1, the current sources associated with the column-drivers of such deselected columns wasted their current by dumping it into the LOW (deselected) column decoder inputs.

In FIG. 2, the LOW signal at the decoder input of any deselected column causes the output impedance of the associated switch to become high, avoiding the wasted current consumption and dissipation.

Furthermore, with so little current wasted in the arrangement of FIG. 2, the single source 29 can be made to have a very high current capacity without straining allowable current consumption limitations. Consequently, it can charge the parasitic capacitances associated with the columns very rapidly and a logic 1 can be produced during a read operation at very high speed.

Figure 3:
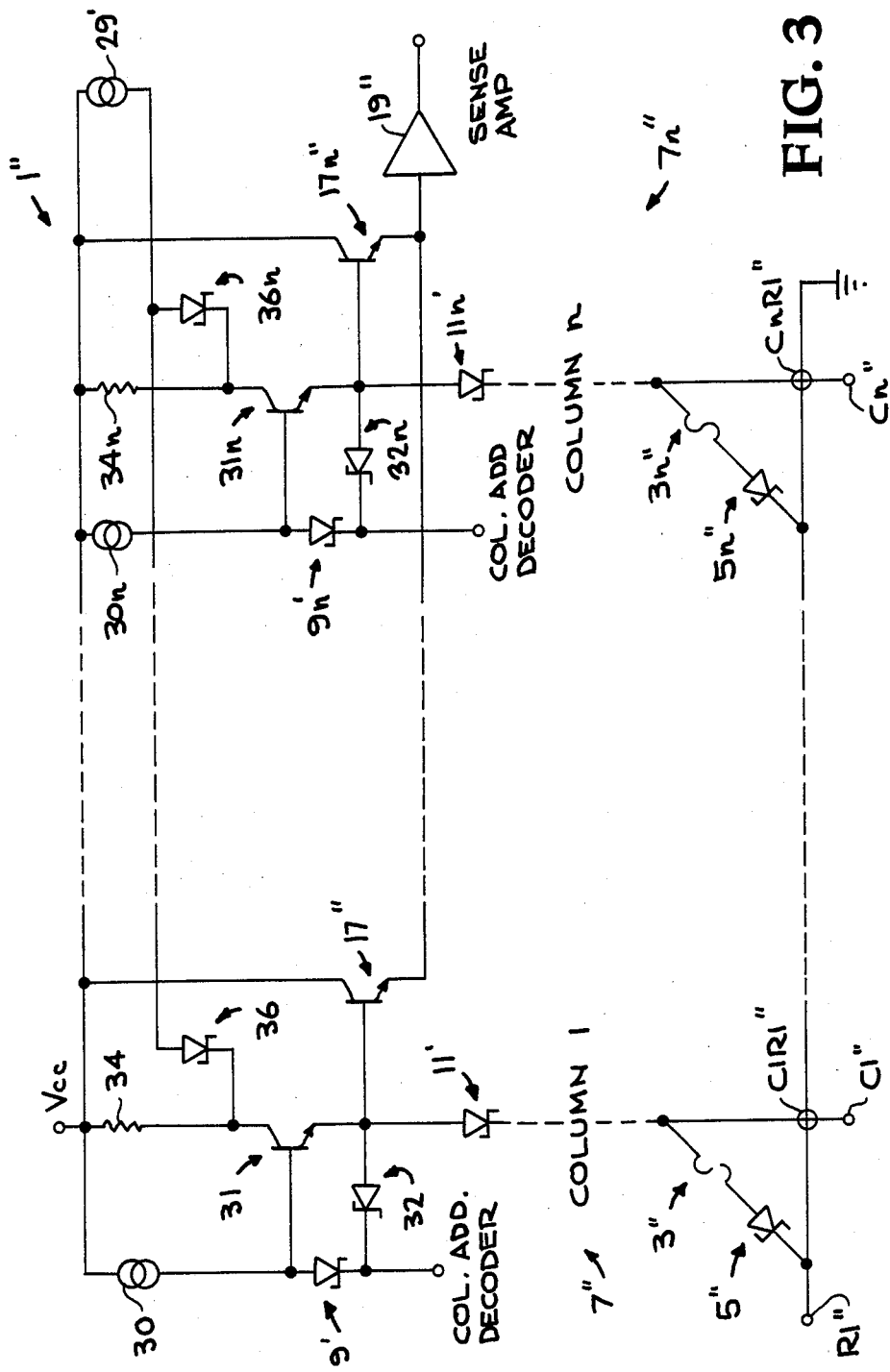
FIG. 3 is a schematic diagram of the circuit of the present invention.

In FIG. 3, the circuit details of a column-driver circuit 1'' which implements the block diagram of FIG. 2 are shown. Once again, only the first column-driver 7''', the last column-driver 7n'', the first row R1'', and the first and last columns C1'' and Cn'' are shown. Bit locations C1R1'' and CnR1'' are shown storing logic 1 and 0, respectively, as before.

Column-driver 7'' utilizes a switching transistor 31 shown here as an NPN transistor together with its associated circuit elements to implement the function of switch 21 in FIG. 2. A Schottky diode 9' connects the base electrode of transistor 31 to the column address decoder input. A second Schottky diode 32 connects the emitter electrode of transistor 31 to the same input.

A current source 30 is connected between the base of 31 and Vcc, the dc supply. The emitter of 31 is connected to column 1 to supply current thereto when transistor 31 conducts. A collector resistor 34 extends between the collector of transistor 31 and Vcc, while a Schottky diode 36 connects the collector of 31 to a common current source 29', which similarly supplies current to the collector electrodes of the similar switching transistors in each of the others of the N column-drivers.

Diodes 9' and 32 are polarized such that when the column address decoder goes LOW (deselect), the base and emitter terminals of transistor 31 are also held LOW, preventing current source 30 from turning transistor 31 on. However, when the column decoder goes HIGH, selecting column C1" for reading, current can flow from source 30 into the base of transistor 31, turning it on and creating a low impedance from its collector to emitter.

Thus, in reading the logic 1 stored at bit location C1R1", transistor 31 is turned on, causing common current source 29' to send current into column 1 to charge the parasitic capacitances thereof. Since the collector-to-emitter impedance of transistor 31 is very low when it is turned on and common current source 29' can deliver relatively high current, the reading of the logic 1 can be very rapid.

As in the case of FIG. 2, low impedance outputs to a sense amplifier 19" are provided by an output driver in the form of emitter-follower transistor 17" and similar transistors in each of the other column-drivers. As the voltage of column 1 rises, emitter-follower transistor 17" provides a low impedance output signal which follows the voltage on the associated column.

When the capacitances of the column are fully charged, current from source 29' flows through transistor 31 into the input of transistor 17". Alternatively, although not shown in FIG. 3, current from source 29' could flow to a high level clamp circuit of the sort shown in FIG. 2 of U.S. Pat. No. 4,215,282, through a Schottky diode like diode D12K of this prior-art patent.

According to a further feature of the invention, the speed with which transistor 31 turns on is increased by providing that the parasitic collector capacitances of all the switching transistors 31 ... 31n are pre-charged or pre-biased. Collector resistor 34 connected between the collector of transistor 31 and Vcc maintains the collector at or near the potential of Vcc during the times when transistor 31 is off. Diode 36 avoids a discharge path from the collector of transistor 31 when it is off and another of the N similar transistors is on.

Consequently, when column-driver 7" is selected, transistor 31 turns on quickly since current source 29' does not have to first charge the collector-to-base and collector-to-substrate parasitic capacitances of transistors 31 ... 31n.

Current source 30 is active continuously and dumps its current into the column decoder whenever column 1 is deselected, as was the case with current source 15 in the prior-art circuit of FIG. 1. However, current source 30 need only be large enough to provide adequate base current to turn transistor 31 on, such that the dissipation and current consumption involved are very small compared to the prior art circuit of FIG. 1.

In comparing FIG. 3 with FIG. 2, it will be realized that each transistor 31 ... 31n is truly a 3-terminal and not a 4-terminal device, such that isolation of its input port (here, the base-emitter junction) and output port (here, the collector-emitter terminals) is not possible. However, for the purposes of the present invention this is not important since the disclosed transistors 31 ... 31n, within the circuit context of FIG. 3, fully implement the input-output transfer function which characterizes the switches 21 ... 21n of the FIG. 2 block diagram.

Although this invention has been described with some particularity in reference to embodiments thereof which, taken together, comprise the best mode known to the inventors for carrying out their invention, many modifications could be made and many alternate embodiments could thus be derived without departing from the scope of the invention. Consequently, the scope of the invention is to be determined only from the following claims.

We claim:

1. In a matrix-array read-only memory device of the type having a plurality M of conductive rows and a plurality N of conductive columns, and wherein each of the N×M bit locations of said matrix defines a discrete memory cell representative of a binary logic 0 or 1 in accordance with the presence or absence of a conductive path between the associated row and column, a column driver circuit for presenting binary logic signals to a sense amplifier coupled to its output, having a plurality N of discrete column address decoder inputs, an associated plurality N of discrete column outputs and one sense-amplifier output, said column driver circuit being responsive to a binary logic select signal on one of its column address inputs and a binary logic deselect signal on each other column address input and responding thereto by producing at its output a bianry logic signal indicative of the presence or absence of a conductive path from the selected column to a selected row, said column-driver circuit comprising:

switch means including at least one first transistor having emitter, base and collector terminals, for responding to logic HIGH and logic LOW voltage signals at said base terminal by producing high and low output impedances between said collector and emitter terminals;

wherein said base terminal means is coupled to an output of said column address decoder;

a first current source coupled to said collector terminal of said at least one first transistor, said emitter terminal of said at least one first transistor being coupled to one of said N columns to supply current thereto from said first current source through said output impedance;

at least one first diode coupled between said base terminal and said column address decoder output, said at least one first diode being coupled therebetween in a sense to conduct current from said base terminal to said column address decoder, and to inhibit current from said column address decoder to said base terminal;

at least one second diode coupled between said emitter terminal and said column address decoder output, said at least one second diode being coupled therebetween in a sense to conduct current from said emitter terminal to said column address decoder, and to inhibit current from said column address decoder to said emitter terminal; and output driver means having a higher impedance input coupled to one of said N columns and a lower impedance output coupled to said sense amplifier and producing in response to a logic voltage signal at said output driver means input a corresponding logic voltage signal at said output driver means output.

2. The apparatus of claim 1 wherein said switch means produces a low output impedance in response to a logic HIGH voltage signal at said base terminal, and a high output impedance in response to a logic LOW signal at said base terminal.

3. The apparatus of claim 1 further including a second current source means coupled to said base terminal of said at least one first transistor to supply input current to said at least one first transistor when the input signal provided to said base terminal is HIGH.

4. The apparatus of claim 1 wherein said column address decoder is coupled to said base terminal and said one of N columns is coupled to said emitter terminal.

5. The apparatus of claim 1 wherein said first current source is coupled to said collector terminal and said emitter terminal is coupled to said one of N columns.

6. The apparatus of claim 1 wherein said output driver means comprises a second transistor having emitter, base, and collector terminals, and wherein said base terminal of said second transistor is coupled to said one of N columns and said emitter terminal of said second transistor is coupled to said sense amplifer.

7. The apparatus of claim 1 wherein said column driver circuit further comprises an output pre-biasing means coupled to said collector terminal of said at least one first transistor to maintain said collector terminal of said at least one first transistor at a high voltage when said output impedance is high.

8. The apparatus of claim 7 wherein said output pre-biasing means comprises: a resistor having one end coupled to said collector terminal of said at least one first transistor; a source of dc voltage coupled to the other end of said resistor; and a diode having an anode terminal coupled to said first current source and a cathode terminal coupled to said collector terminal of said at least one first transistor.

9. The apparatus of claim 1 wherein said column driver circuit comprises:
a plurality N of switch means, each including at least one respective first transistor including respective base, emitter and collector terminals, said base terminal of each of said first transistors being coupled to a corresponding one of the N outputs of said column address decoder, for producing in response to a logic HIGH signal at said base terminal a low output impedance between said emitter and collector terminals and for producing in response to a logic LOW signal at said base terminal a high output impedance between said emitter and collector terminals;
a first current source coupled in common to respective collector terminals of each of said first transistors, each of the other of said output terminals being coupled to a corresponding one of the N columns to supply current thereto from said first current source through said output impedance; and
a plurality N of output driver means, each having a high impedance input coupled to a corresponding one of said N columns and a lower impedance output coupled in common to the input of said sense amplifier and producing in response to a logic signal at said driver input a corresponding logic signal at said driver output.

10. The apparatus of claim 9 further including a plurality N of second current sources, each one coupled to said base terminal of a corresponding one of said first transistors to supply input current thereto when the input signal thereof is HIGH.

11. In a matrix-array read-only memory device of the type having a plurality M of conductive rows and a plurality N of conductive columns, and wherein each of the N×M bit locations of said matrix defines a discrete memory cell representative of a binary logic 0 or 1 in accordance with the presence or absence of a conductive path between the associated row and column, a column driver circuit for presenting binary logic signals to a sense amplifier coupled to its output, having a plurality N of discrete column address decoder inputs, an associated plurality N of discrete column outputs and one sense amplifier output, said column driver circuit being responsive to a binary logic select signal on one of its column address inputs and a binary logic deselect signal on each other column address input and responding thereto by producing at its output a binary logic signal indicative of the presence or absence of a conductive path from the selected column to a selected row, said column-driver circuit comprising:
a plurality N of switching transistors, each having a base terminal coupled to one of the N column address decoder inputs, each having an emitter terminal coupled to a corresponding one of the N columns, and each having a collector terminal;
a common current source coupled to each of the collector terminals of said N switching transistors to supply current thereto;
a plurality N of output driver means, each having a higher impedance input coupled to one of said N columns and a lower impedance output coupled to said sense amplifier and producing in response to a logic signal at said input a corresponding logic signal at said output;
a plurality N of second current sources, each one coupled to the base terminal of respective of said N switching transistors to supply input current thereto;
a plurality of respective first diodes, each respective first diode being coupled between a respective transistor base terminal and a column address decoder output, each of said first diodes being coupled therebetween in a sense to conduct current from said respective base terminal to said column address decoder, and to inhibit current from said column address decoder to said respective base terminal; and
a plurality of respective second diodes, each respective second diode being coupled between a respective transistor emitter terminal and column address decoder output, each of said second diodes being coupled therebetween in a sense to conduct current from said respective emitter terminal to said column address decoder, and to inhibit current from said column address decoder to said emitter terminal.

12. The apparatus of claim 11 wherein said column driver circuit further comprises an output pre-biasing means coupled to each collector terminal of said N switching transistors to maintain said collector terminal at a high voltage when said switching transistor is turned off.

13. The apparatus of claim 12 wherein said output pre-biasing means comprises: a plurality N of resistors, each resistor having one end coupled to one of said collector terminals; a source of dc voltage coupled to the other end of each said resistor; and a plurality N of diodes, each having an anode terminal coupled to said common current source and a cathode terminal coupled to one of said N collector terminals.

* * * * *